US012687582B2

(12) United States Patent
Narimoto et al.

(10) Patent No.:  US 12,687,582 B2
(45) Date of Patent:          Jul. 21, 2026

(54) CORRECTION METHOD FOR ESTIMATED STATE-OF-CHARGE VALUE OF ENERGY STORAGE DEVICE, MANAGEMENT APPARATUS FOR ENERGY STORAGE DEVICE, AND ENERGY STORAGE APPARATUS

(71) Applicant: GS Yuasa International Ltd., Kyoto (JP)

(72) Inventors: Satoru Narimoto, Kyoto (JP); Takeyuki Shiraishi, Kyoto (JP)

(73) Assignee: GS YUASA INTERNATIONAL LTD., Kyoto (JP)

( * ) Notice:  Subject to any disclaimer, the term of this patent is extended or adjusted under 35 U.S.C. 154(b) by 338 days.

(21) Appl. No.:  17/635,497

(22) PCT Filed:  Aug. 7, 2020

(86) PCT No.:  PCT/JP2020/030290
§ 371 (c)(1),
(2) Date:  Feb. 15, 2022

(87) PCT Pub. No.:  WO2021/039355
PCT Pub. Date:Mar. 4, 2021

(65) Prior Publication Data
US 2022/0291286 A1      Sep. 15, 2022

(30) Foreign Application Priority Data

Aug. 27, 2019      (JP) ................................. 2019-154494

(51) Int. Cl.
*G01R 31/374*          (2019.01)
*G01R 31/3828*        (2019.01)
(Continued)

(52) U.S. Cl.
CPC ....... *G01R 31/374* (2019.01); *G01R 31/3828* (2019.01); *H01M 10/44* (2013.01);
(Continued)

(58) Field of Classification Search
CPC . G01R 31/374; G01R 31/3828; H02J 7/0048; H01M 10/44; H01M 10/486; H01M 2220/20
See application file for complete search history.

(56)              References Cited

U.S. PATENT DOCUMENTS

| | | |
|---|---|---|
| 2002/0036482 A1 | 3/2002 | Nakatsuji |
| 2007/0216349 A1 | 9/2007 | Sakaue et al. |

(Continued)

FOREIGN PATENT DOCUMENTS

| | | |
|---|---|---|
| JP | H06-153413 A | 5/1994 |
| JP | 2002-058171 A | 2/2002 |

(Continued)

OTHER PUBLICATIONS

International Search Report (ISR) (PCT Form PCT/ISA/210), in PCT/JP2020/030290, dated Nov. 2, 2020.

*Primary Examiner* — Stephanie E Bloss
*Assistant Examiner* — Michael A Harrison
(74) *Attorney, Agent, or Firm* — MCGINN INTELLECTUAL PROPERTY LAW GROUP, PLLC

(57)              ABSTRACT

A correction method for an estimated state-of-charge (SOC) value of a battery cell 12 estimated by a current integration method, the method including: a charge step of a battery cell 12; a determination step of determining a correction value of the estimated value based on an amount of electricity charged during a period from a start of charge of the battery cell 12 to a decrease in a current value of a charge current to a predetermined threshold I_thr; and a correction step of
(Continued)

correcting the estimated value based on the correction value determined in the determination step.

13 Claims, 13 Drawing Sheets

(51) Int. Cl.
| | |
|---|---|
| *H01M 10/44* | (2006.01) |
| *H01M 10/48* | (2006.01) |
| *H02J 7/00* | (2026.01) |
| *H02J 7/82* | (2026.01) |

(52) U.S. Cl.
CPC ............. *H01M 10/486* (2013.01); *H02J 7/82* (2026.01); *H01M 2220/20* (2013.01)

(56) References Cited

U.S. PATENT DOCUMENTS

| | | | |
|---|---|---|---|
| 2009/0033292 A1 | 2/2009 | Majima | |
| 2009/0102428 A1 | 4/2009 | Aradachi et al. | |
| 2012/0091969 A1* | 4/2012 | Izumi ...................... | B60L 58/13 |
| | | | 320/148 |
| 2014/0236379 A1 | 8/2014 | Masuda et al. | |

| | | | |
|---|---|---|---|
| 2015/0022158 A1 | 1/2015 | Osawa et al. | |
| 2015/0212161 A1 | 7/2015 | Soga et al. | |
| 2015/0293183 A1* | 10/2015 | Tenmyo ............... | G01R 31/392 |
| | | | 324/429 |
| 2015/0362557 A1 | 12/2015 | Takashima et al. | |
| 2016/0370431 A1* | 12/2016 | Sejima ................. | G01R 31/392 |
| 2020/0094707 A1 | 3/2020 | Fukushima | |

FOREIGN PATENT DOCUMENTS

| | | |
|---|---|---|
| JP | 2007-234252 A | 9/2007 |
| JP | 2007274813 A | 10/2007 |
| JP | 2008-277136 A | 11/2008 |
| JP | 2008-278624 A | 11/2008 |
| JP | 2009-031220 A | 2/2009 |
| JP | 2011-007564 A | 1/2011 |
| JP | 2011-215125 A | 10/2011 |
| JP | 2012028936 A | 2/2012 |
| JP | 2013-101072 A | 5/2013 |
| JP | 2013-213808 A | 10/2013 |
| JP | 2014-173953 A | 9/2014 |
| JP | 2015-215272 A | 12/2015 |
| JP | 2017-112648 A | 6/2017 |
| JP | 2018119828 A | 8/2018 |
| WO | 2013/051151 A1 | 10/2011 |
| WO | 2014/046232 A1 | 9/2013 |
| WO | WO 2018/181489 A1 | 10/2018 |

* cited by examiner

CORRECTION METHOD FOR ESTIMATED STATE-OF-CHARGE VALUE OF ENERGY STORAGE DEVICE, MANAGEMENT APPARATUS FOR ENERGY STORAGE DEVICE, AND ENERGY STORAGE APPARATUS

TECHNICAL FIELD

The technology disclosed in the present specification relates to a correction method for an estimated state-of-charge value of an energy storage device, a management apparatus of the energy storage device, and an energy storage apparatus.

BACKGROUND ART

As a method for estimating a state of charge (SOC) of an energy storage device such as a lithium ion secondary battery, a current integration method is known. The current integration method is a method in which a current value of a charge-discharge current of an energy storage device is measured at predetermined time intervals with a current sensor, and the SOC [%] is estimated by adding or subtracting the measured current value to or from an initial value.

The current integration method has a problem that errors (a measurement error of the current sensor, an error caused by an individual difference in a consumption current of a management apparatus that manages the energy storage device, an error caused by an individual difference in the self discharge of the energy storage device, etc.) accumulate as time passes. For this reason, conventionally, a so-called "full-charge reset" is performed in which the SOC is corrected to a predetermined correction value at a time point when the energy storage device is fully charged and charging is completed.

As a method for determining whether or not the full charge is completed, for example, a method described in Patent Document 1 is known. In the method described in Patent Document 1, constant current charge is performed by supplying a charge current Ic having a current value Ice from a battery charger, and when a terminal voltage Vt of an assembled battery reaches a preset charge-end voltage Vf, switching is made to constant voltage charge in which the assembled battery is charged by applying the charge-end voltage Vf. In the method described in Patent Document 1, when the charge current Ic flowing through the assembled battery becomes equal to or less than an end-of-charge current value Ia, it is determined that the assembled battery is fully charged, and the charging is terminated.

The current characteristic of the charge current varies depending on the temperature. For this reason, conventionally, a change is made in a threshold for determining whether or not full charge is completed in accordance with the temperature (e.g., see Patent Document 2.). Specifically, Patent Document 2 describes that a temperature of a secondary battery is measured, and a full-charge detection current value, which is a current value for stopping charging, is changed based on the temperature.

PRIOR ART DOCUMENTS

Patent Documents

Patent Document 1: JP-A-2008-277136 (paragraph [0041])

Patent Document 2: JP-A-2002-58171 (paragraph [0020])

SUMMARY OF THE INVENTION

Problems to be Solved by the Invention

The conventional full-charge reset has room for improvement in the accurate collection of the estimated SOC value. The present specification discloses a technique capable of accurately correcting an estimated SOC value.

Means for Solving the Problems

A correction method for an estimated state-of-charge value of an energy storage device estimated by a current integration method includes: a charge step of the energy storage device; a determination step of determining a correction value of the estimated state-of-charge value based on an amount of electricity charged during a period from a start of charge of the energy storage device to a decrease in a current value of a charge current to a predetermined threshold; and a correction step of correcting the estimated state-of-charge value based on the correction value determined in the determination step.

Advantages of the Invention

According to the above configuration, the estimated SOC value (estimated state-of-charge value) can be corrected accurately.

MODE FOR CARRYING OUT THE INVENTION

Summary of Present Embodiment (1) A correction method for an estimated state-of-charge value of an energy storage device estimated by a current integration method includes: a charge step of the energy storage device; a determination step of determining a correction value of the estimated state-of-charge value based on an amount of electricity charged during a period from a start of charge of the energy storage device to a decrease in a current value of a charge current to a predetermined threshold; and a correction step of correcting the estimated state-of-charge value based on the correction value determined in the determination step.

Figure 1:
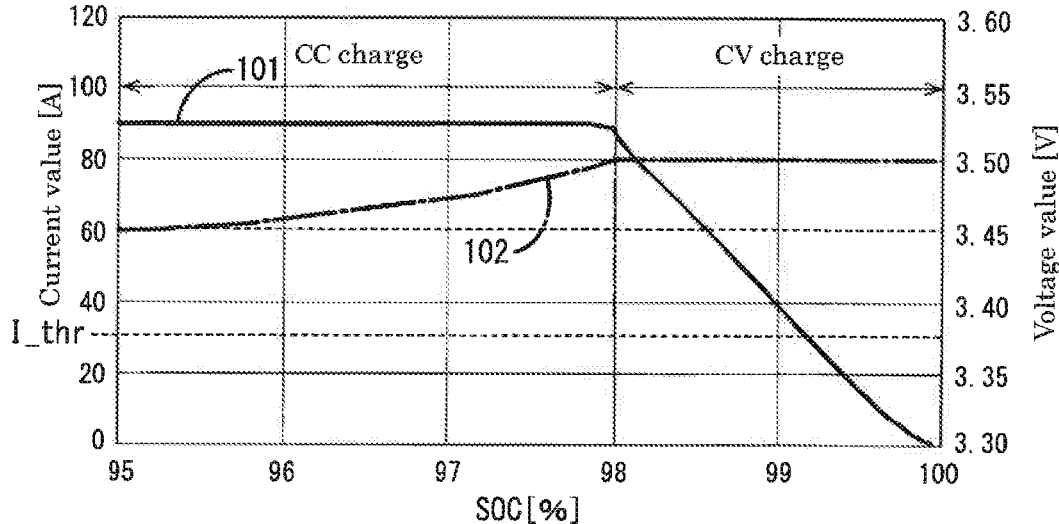
FIG. 1 is a graph explaining charging of an energy storage device.

The charging of the energy storage device will be described with reference to FIG. 1. In FIG. 1, a solid line 101 indicates a current value, and a dashed line 102 indicates a voltage value. In an example illustrated in FIG. 1, constant current charge (CC charge) is performed at a constant current value (constant current) until the voltage value reaches 3.50 V (an example of a predetermined voltage value), and constant voltage charge (CV charge) is performed at a constant voltage value (constant voltage) when the voltage value reaches 3.50 V. When the charging is switched to the constant voltage charge, the current value of the charge current gradually decreases, and when the current value decreases to a predetermined threshold I_thr, the charging is terminated. For convenience, in the following description, a state where the current value has decreased to the predetermined threshold I_thr is referred to as full charge. Full charge does not necessarily mean that the SOC is 100%.

The above correction method uses a current characteristic representing the relationship between the SOC and the charge current. For example, in the case of the current characteristic illustrated in FIG. 1, the SOC when the energy storage device is fully charged (when the current value decreases to the threshold I_thr) is approximately 99.2%. Therefore, when an estimated SOC value (estimated state-of-charge value) at the time of full charge of the energy storage device is corrected to 99.2% (corresponding to a correction value), errors having accumulated by the current integration method can be eliminated.

Figure 2:
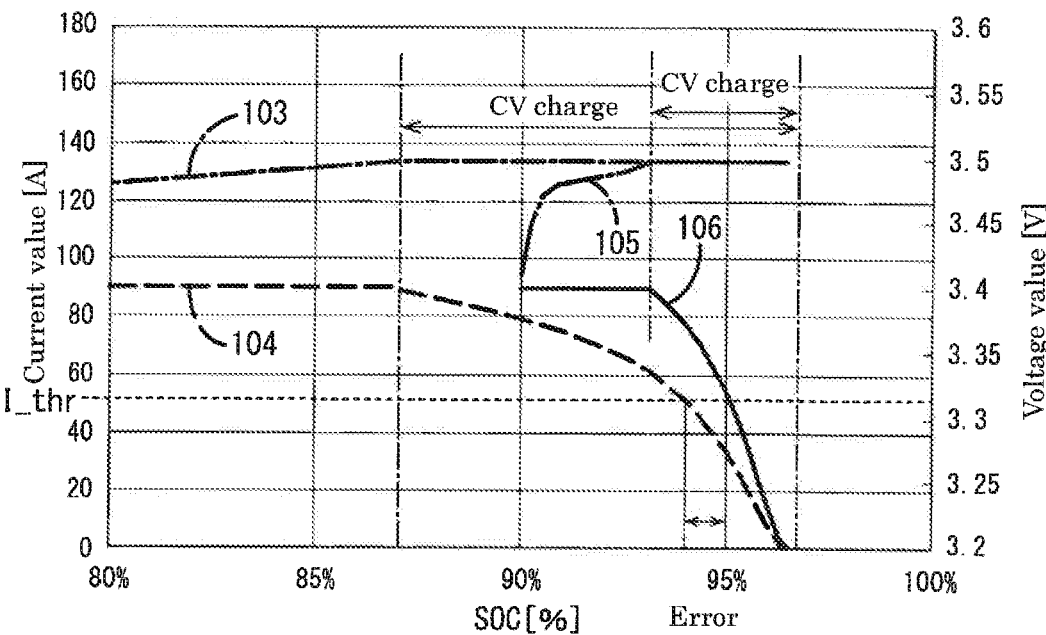
FIG. 2 is a graph of a current value and a voltage value when the charge is started in a state where an SOC is 80%, and a graph of a current value and a voltage value when the charge is started in a state where the SOC is 90%.

It is known that the current characteristic described above vary depending on the temperature of the energy storage device. The inventor of the present application has found that the current characteristic varies depending on the SOC at the start of charge in addition to the temperature. Specifically, as illustrated in FIG. 2, the inventor of the present application conducted an experiment of starting charge in a state where the SOC is 80% and an experiment of starting charge in a state where the SOC is 90%. In FIG. 2, a dashed line 103 indicates a change in voltage value when the charge is started in an 80% state, and a dotted line 104 indicates a change in current value. A dashed line 105 indicates a change in voltage value when the charge is started in a 90% state, and a solid line 106 indicates a change in current value. As can be seen from FIG. 2, in this experiment, the lower the SOC at the start of charge, the faster the shift to the constant voltage charge.

As can be seen from FIG. 2, when the shift is made to the constant voltage charge at an early time point, a time point at which the current value decreases to the threshold I_thr also becomes earlier. For this reason, if the SOC is corrected with the same correction value when the full charge is reached in either a case where the charge is started in a low SOC state or a case where the charge is started in a high SOC state, the accuracy of the correction decreases depending on the SOC at the start of charge.

As a result of intensive studies, the inventor of the present application has obtained a finding that there is a correlation between the amount of electricity charged during a period from the start of charge of the energy storage device to the full charge of the energy storage device and the SOC at the completion of the full charge.

According to the above correction method, the correction value is determined based on the amount of electricity charged during the period from the start of charge of the energy storage device to the full charge of the energy storage device. Therefore, the estimated SOC value can be accurately corrected regardless of the SOC at the start of charge.

(2) The energy storage device may have a plateau region in which the amount of change in open circuit voltage with respect to the amount of change in state of charge is small.

Figure 3:
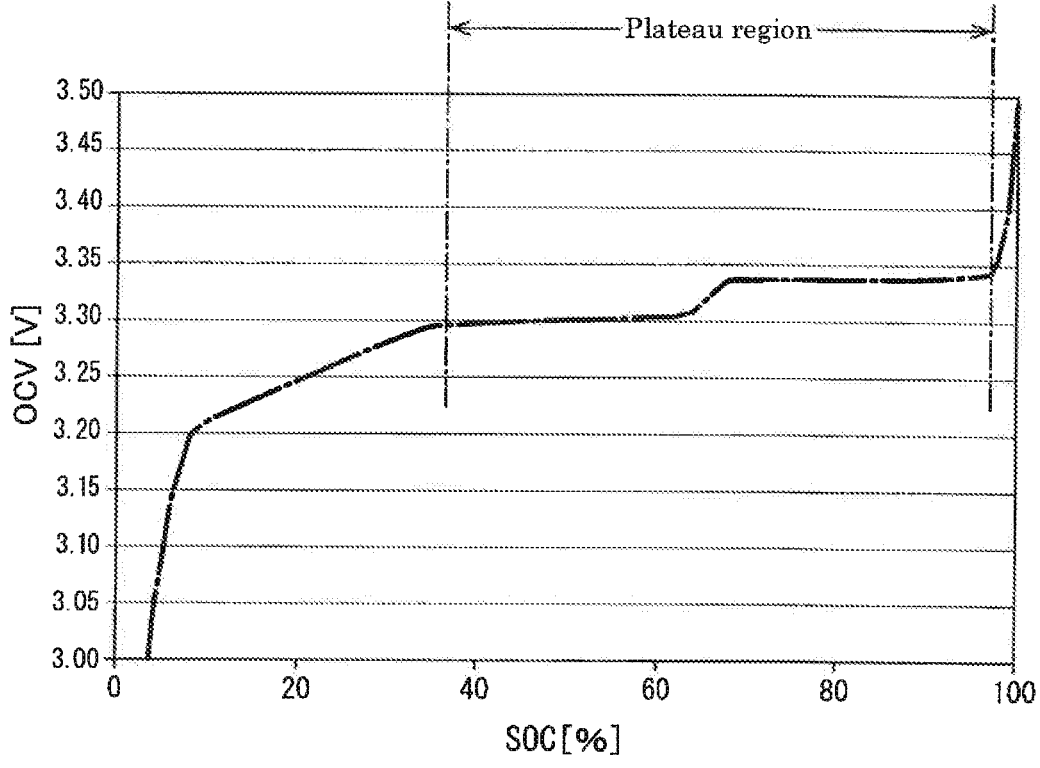
FIG. 3 is a graph illustrating a relationship between an SOC and an open-circuit voltage (OCV) of an energy storage device having a plateau region.

The plateau region will be described with reference to FIG. 3. The plateau region refers to a region in which the amount of change in open circuit voltage (OCV) with respect to the amount of change in SOC is small in an SOC-OCV curve representing the correlation between the OCV and the SOC of the energy storage device. Specifically, for example, a region where the amount of change in OCV with respect to the amount of change in SOC is 2 [mV/%] or less is referred to as the plateau region. As an energy storage device having a plateau region, for example, an LFP/Gr-based lithium ion secondary battery is known. In the case of the energy storage device having the plateau region, the full-charge reset is performed in a region where the SOC is higher than that in the plateau region.

As described above, the lower the SOC at the start of charge, the faster the shift to the constant voltage charge. In the case of the energy storage device having the plateau region, the reason is presumed as follows. For example, in an LFP-based (iron-based) lithium ion secondary battery, the plateau region is wide, and the voltage does not increase immediately even when the SOC becomes high (e.g., 90%). However, the charge current is less likely to enter the battery as the SOC becomes higher. If the charge is started from a high SOC (e.g., 90%) at which the charge is switched to the constant voltage charge when the charge is started from a low SOC (e.g., 50%), the voltage of the battery is still a low value in the plateau region, and the charge current hardly enters the battery, so that it takes time to reach a voltage for switching to the constant voltage charge. As a result, the lower the SOC at the start of charge, the faster the shift to the constant voltage charge.

As a method of estimating the SOC of the energy storage device, in addition to the current integration method, a method of measuring the OCV of the energy storage device and specifying the SOC corresponding to the measured OCV from the SOC-OCV curve is known. Since it is difficult to accurately specify the SOC from the OCV in the plateau region, the SOC is generally estimated by the current integration method in the case of the energy storage device having the plateau region. However, as described above, the current integration method has a problem that errors accumulate. Thus, in the case of the energy storage device having the plateau region, a method for accurately correcting the estimated SOC value is required.

According to the above correction method, the correction value is determined based on the amount of electricity charged during the period from the start of charge of the energy storage device to the full charge of the energy storage device, so that the estimated SOC value can be corrected accurately. Hence the present invention is particularly useful in the case of the energy storage device having the plateau region.

(3) The correction method may include an update step of measuring a temperature of the energy storage device at predetermined time intervals with a temperature sensor when the charge of the energy storage device is started and updating the threshold in accordance with the measured temperature.

Figure 4:
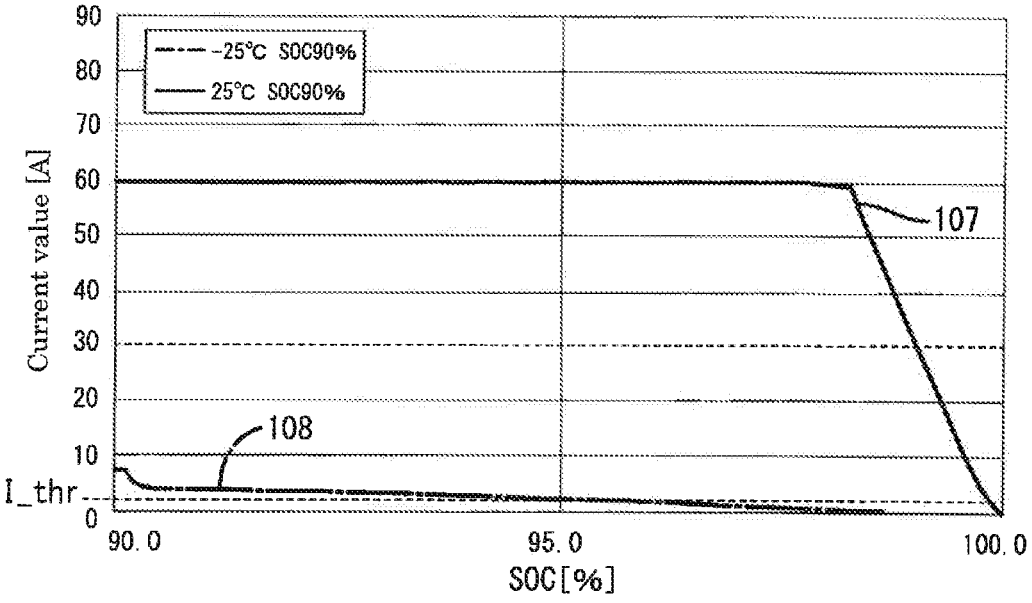
FIG. 4 is a graph illustrating a relationship between a temperature and a current value.

In FIG. 4, a solid line 107 indicates a current characteristic when the temperature of the energy storage device is 25° C. (at normal temperature), and a dashed line 108 indicates a current characteristic when the temperature of the energy storage device is −25° C. (at low temperature). As illustrated in FIG. 4, since the current characteristic varies depending on the temperature of the energy storage device, the threshold described above is also set in accordance with the temperature. Since the internal resistance of the energy storage device is high at low temperature, for example, in a case where the energy storage device is a lithium ion secondary battery, it is necessary to reduce the charge current in order to prevent Li electrodeposition to the negative electrode at the time of the constant current charge even when the energy storage device is charged from a low SOC, and the gradient of the current characteristic during the constant voltage charge becomes smaller than that at normal temperature. When the gradient is small, it is difficult to accurately determine whether or not the current value has decreased to the threshold. For this reason, there has been a problem in the accuracy of correction at low temperature.

When the charge of the energy storage device is started, the temperature of the energy storage device increases gradually. The gradient of the current characteristic increases as the temperature of the energy storage device increases. Therefore, when the temperature of the energy storage device changes, the threshold is updated in accordance with the temperature after the change, thereby facilitating determination as to whether or not the current value has decreased to the threshold with an increase in the temperature of the energy storage device. Hence the accuracy of correction at low temperature is improved as compared to a case where the threshold corresponding to the temperature at the start of charge is used as it is even when the temperature of the energy storage device changes.

(4) In the determination step, the correction value may be determined based on the temperature of the energy storage device and the amount of electricity.

According to the above correction method, with the correction value being determined based on the temperature and the amount of electricity charged, the estimated SOC value can be accurately corrected as compared to the case has been described as an example where the correction value is determined only from the amount of charged electricity.

(5) In the determination step, an eigenvalue [Ah] corresponding to a combination of the temperature of the energy storage device and the amount of electricity is acquired from eigenvalue information in which the combination of the temperature of the energy storage device and the amount of electricity is associated with the eigenvalue, and the correction value may be determined from Equation 1 below:

$$\text{Correction value } [\%] = (\text{actual capacity of energy storage device } [Ah] - \text{eigenvalue } [Ah])/\text{actual capacity of energy storage device } [Ah] \times 100 \quad <\text{Equation 1}>.$$

The energy storage device deteriorates with use, and an actual chargeable capacity (so-called "full charge capacity") decreases. Even when the amounts of electricity are the same, when the actual capacities are different, appropriate correction values are different.

According to the above correction method, an eigenvalue corresponding to a combination of the temperature of the energy storage device and the amount of charged electricity is determined in advance by experiments to create eigenvalue information, and the correction value is determined by Equation 1, whereby the correction value can be determined in accordance with deterioration in the energy storage device. Therefore, even when the energy storage device deteriorates, the correction value can be determined appropriately.

(6) The energy storage device is an engine starting energy storage device for starting an engine of a vehicle, and in the determination step, when a time from the last stop of the engine to a start of the engine is equal to or shorter than a predetermined time, a correction value of the estimated state-of-charge value may be determined based on a total value of an amount of electricity charged during a period from a start of the engine and a start of charge of the energy storage device last time to the last stop of the engine and an amount of electricity charged during a period from a start of the engine and a start of charge of the energy storage device this time to a decrease in the current value of the charge current to the threshold.

When a current flows through the energy storage device, the internal resistance of the energy storage device changes due to polarization. It takes a certain amount of time to eliminate the polarization, so that there is a possibility that the polarization is not eliminated when the time from the stop of the engine to the start of the engine is a predetermined time or less. The current characteristics of the charge current are different between a case where the polarization has been eliminated and a case where the polarization has not been eliminated, so that there is a possibility that the accuracy of correction is lowered unless the influence of the polarization is considered in the case has been described as an example where the polarization has not been eliminated.

According to the above correction method, when the time from the last stop of the engine to the start of the engine is a predetermined time or less, the correction value can be determined in consideration of the influence of polarization. It is thus possible to prevent a decrease in the accuracy of correction due to the influence of polarization.

(7) A management apparatus for an energy storage device includes: a current sensor that measures a charge-discharge current of the energy storage device; and a management part. The management part performs estimation processing of measuring the charge-discharge current of the energy storage device with a current sensor and estimating a state of charge of the energy storage device by a current integration method, determination processing of determining a correction value of an estimated state-of-charge value estimated in the estimation processing based on an amount of electricity charged during a period from a start of charge of the energy storage device to a decrease in a current value of a charge current to a predetermined threshold; and correction processing of correcting the estimated state-of-charge value based on the correction value determined in the determination processing.

According to the management apparatus, the estimated SOC value can be accurately corrected regardless of the SOC at the start of charge.

(8) An energy storage apparatus including: an energy storage device; and the management apparatus according to claim 7.

According to the energy storage apparatus, the estimated SOC value can be accurately corrected regardless of the SOC at the start of charge.

The invention disclosed by the present specification can be achieved in various aspects such as an apparatus, a method, a computer program for achieving the apparatus or the method, and a recording medium on which the computer program is recorded.

First Embodiment

A first embodiment will be described with reference to FIGS. 5 to 12. In the following description, reference numerals of the drawings may be omitted for the same constituent members except for some of them.

Figure 5:
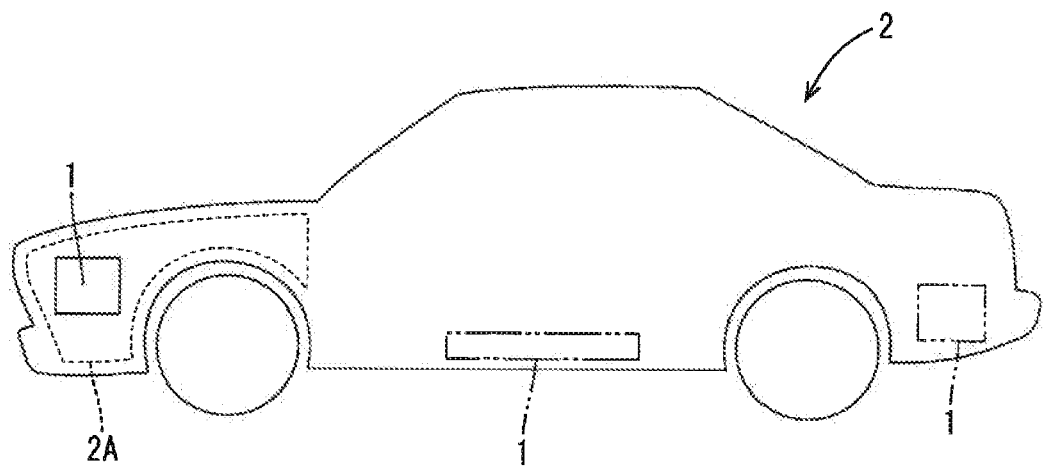
FIG. 5 is a schematic view of an energy storage apparatus according to a first embodiment and an automobile mounted with the energy storage apparatus.

A battery 1 (an example of an energy storage apparatus) according to a first embodiment will be described with reference to FIG. 5. An automobile 2 (an example of a vehicle) illustrated in FIG. 5 is an engine automobile and includes a starter for starting an engine. The battery 1 is a battery for starting the engine that is mounted on an automobile 2 and supplies electric power to the starter. The battery 1 is charged by an alternator of the automobile 2 when the engine starts. Although FIG. 5 illustrates a case where the battery 1 is housed in an engine room 2A, the battery 1 may be housed under a floor or in a trunk of a cabin.

(1) Structure of Battery

Figure 6:
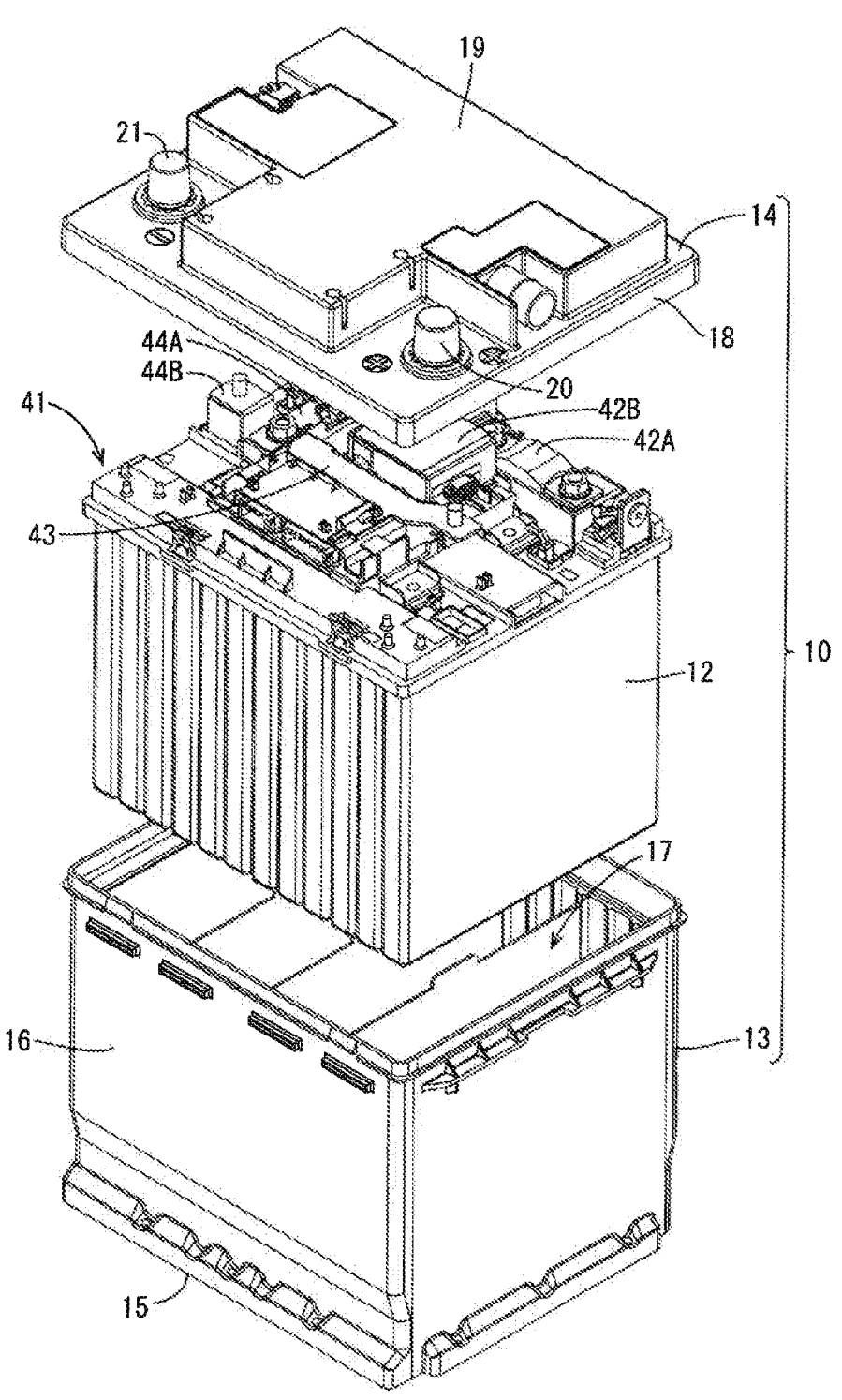
FIG. 6 is an exploded perspective view of the energy storage apparatus.

As illustrated in FIG. 6, the battery 1 includes an outer case 10 and a plurality of battery cells 12 (an example of an energy storage device) housed inside the outer case 10. The outer case 10 includes a body 13 made of a synthetic resin material and a lid 14. The body 13 has a bottomed cylindrical shape and is made up of a bottom surface 15 having a rectangular shape in a plan view and four side surfaces 16 rising from the four sides of the bottom surface 15 to form a rectangular cylindrical shape. An upper opening 17 is formed at the upper-end portion by the four side surfaces 16.

The lid 14 is rectangular in the plan view, and a frame body 18 extends downward from four sides thereof. The lid 14 closes an upper opening 17 of the body 13. A protrusion 19 having a substantially T-shape in the plan view is formed on the upper surface of the lid 14. A positive external terminal 20 is fixed to one corner of two portions where the protrusion 19 is not formed on the upper surface of the lid 14, and a negative external terminal 21 is fixed to the other corner.

The battery cell 12 is a rechargeable secondary battery and is specifically a lithium ion secondary battery, for example. More specifically, the battery cell 12 is an LFP-based or Gr-based lithium ion secondary battery and has the plateau region described above.

Figure 7A:
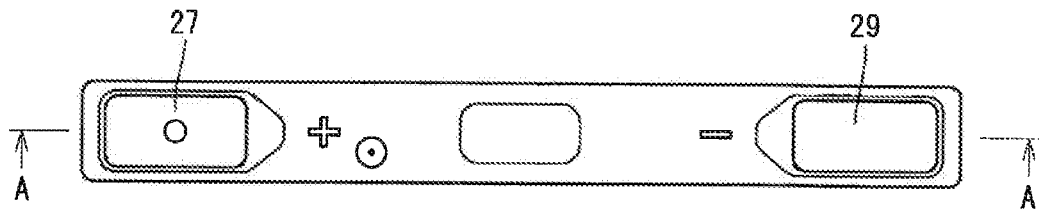
FIG. 7A is a plan view of the energy storage device illustrated in FIG. 6.
Figure 7B:
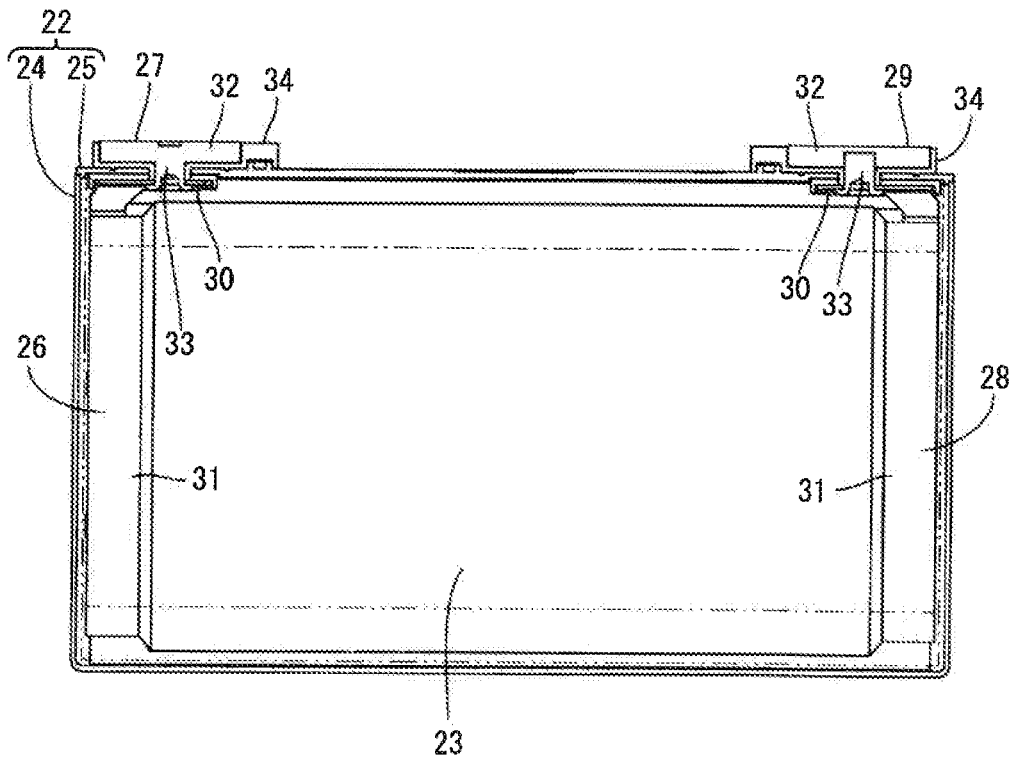
FIG. 7B is a cross-sectional view taken along line A-A illustrated in FIG. 7A.

As illustrated in FIGS. 7A and 7B, the battery cell 12 houses an electrode assembly 23 in a rectangular parallel-epiped case 22 together with a nonaqueous electrolyte. The case 22 is made up of a case body 24 and a cover 25 that closes an opening at the upper portion of the case body 24.

Although not illustrated in detail, the electrode assembly 23 has a separator, made of a porous resin film, disposed between a negative electrode element formed by applying an active material to a substrate made of copper foil and a positive electrode element formed by applying an active material to a substrate made of aluminum foil. Each of these is a belt-like shape, and is wound in a flat shape so as to be accommodated in the case body 24 in a state where the negative electrode element and the positive electrode element are displaced from each other on the opposite side in the width direction with respect to the separator.

A positive electrode terminal 27 is connected to the positive electrode element via a positive current collector 26. A negative electrode terminal 29 is connected to the negative electrode element via a negative current collector 28. The positive current collector 26 and the negative current collector 28 each have a plate-like base 30 and a leg 31 extending from the base 30. A through hole is formed in the base 30. The leg 31 is connected to the positive electrode element or the negative electrode element. The positive electrode terminal 27 and the negative electrode terminal 29 each have a terminal body portion 32 and a shaft 33 protruding downward from the center part of its lower surface. Among those, the terminal body portion 32 and the shaft 33 of the positive electrode terminal 27 are integrally formed of aluminum (single material). In the negative electrode terminal 29, the terminal body portion 32 is made of aluminum, the shaft 33 is made of copper, and these are assembled. The terminal body portions 32 in the positive electrode terminal 27 and the negative electrode terminal 29 are disposed at both ends of the cover 25 via gaskets 34 made of an insulating material and are exposed outward from the gaskets 34.

Figure 8:
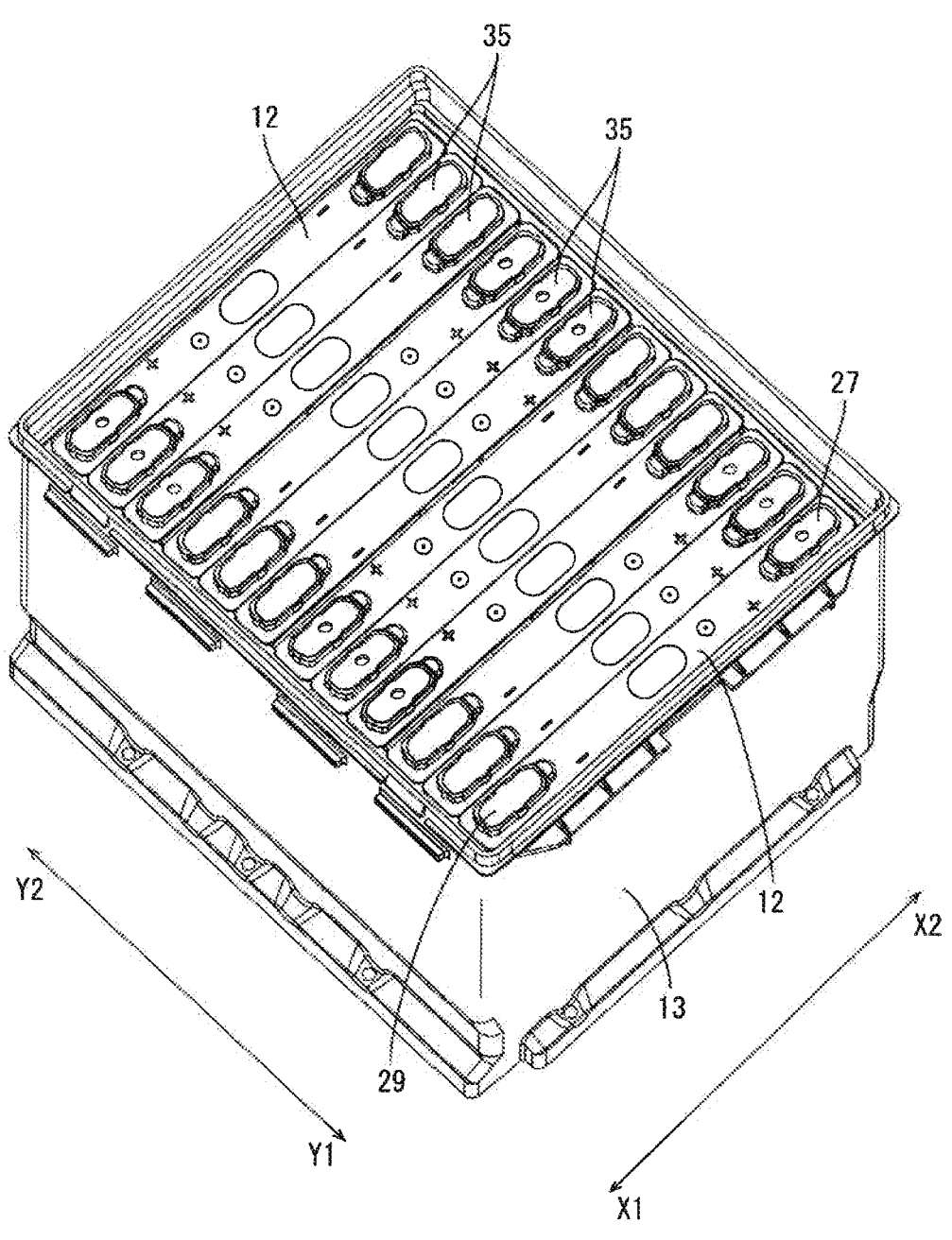
FIG. 8 is a perspective view illustrating a state where the energy storage device is housed in a body in FIG. 6.

As illustrated in FIG. 8, a plurality of (e.g., twelve) battery cells 12 are housed in the body 13 in parallel in the width direction. Here, the three battery cells 12 are arranged as a set from one end side to the other end side (arrow Y1 to Y2) of the body 13 such that the terminal polarities of the adjacent battery cells 12 are the same in the same pair, and the terminal polarities of the adjacent battery cells 12 are opposite in the adjacent pair. In the three battery cells 12 (first set) located closest to an arrow Y1 side, an arrow X1 side is a negative electrode, and the arrow X2 side is a positive electrode. In the three battery cells 12 (second set) adjacent to the first set, the arrow X1 side is a positive electrode, and the arrow X2 side is a negative electrode. Further, in a third set adjacent to the second set, the arrangement is the same as in the first set, and in a fourth set adjacent to the third set, the arrangement is the same as in the second set.

Figure 9:
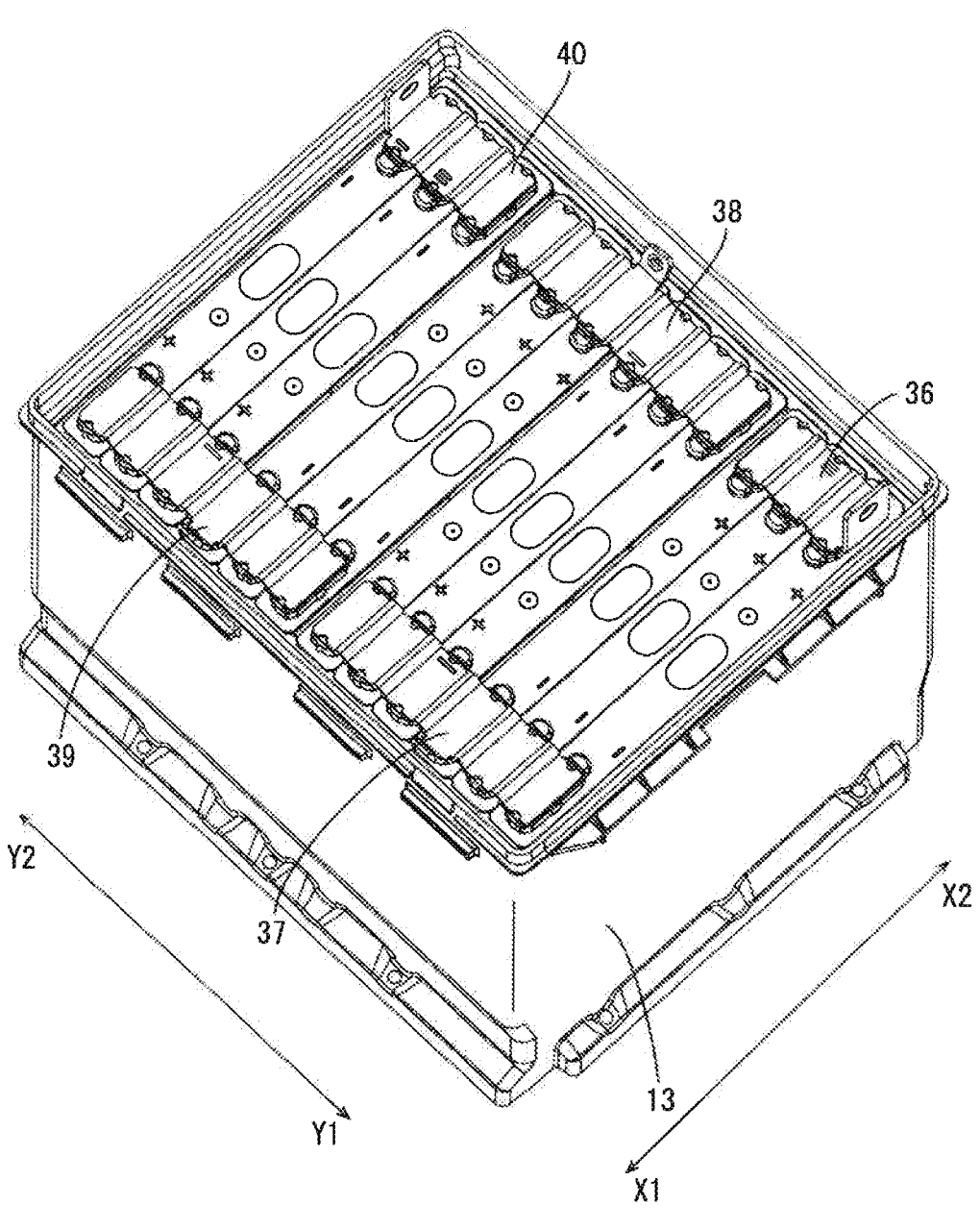
FIG. 9 is a perspective view illustrating a state where busbars are mounted on the energy storage device of FIG. 8.

As illustrated in FIG. 9, terminal busbars 36 to 40 as conductive members are connected to the positive electrode terminal 27 and the negative electrode terminal 29 by welding. On the arrow X2 side of the first set, the group of the positive electrode terminals 27 is connected by a first busbar 36. Between the first set and the second set, the group of the negative electrode terminals 29 in the first set and the group of the positive electrode terminals 27 in the second set are connected by a second busbar 37 on the arrow X1 side. Between the second set and the third set, the group of the negative electrode terminals 29 in the second set and the group of the positive electrode terminals 27 in the third set are connected by a third busbar 38 on the arrow X2 side. Between the third set and the fourth set, the group of the negative electrode terminals 29 in the third set and the group of the positive electrode terminals 27 in the fourth set are connected by a fourth busbar 39 on the arrow X1 side. On the arrow X2 side of the fourth set, the group of the negative electrode terminals 29 is connected by a fifth busbar 40.

Referring also to FIG. 6, the first busbar 36 located at one end of electrical flow is connected to the positive external terminal 20 via first electronic equipment 42A (e.g., fuse), second electronic equipment 42B (e.g., relay), a busbar 43, and a busbar terminal (not illustrated). A fifth busbar 40 located at the other end of the electric flow is connected to the negative external terminal 21 via busbars 44A, 44B and a negative electrode busbar terminal (not illustrated). As a result, each battery cell 12 can be charged and discharged via the positive external terminal 20 and the negative external terminal 21. The electronic equipment 42A, 42B and the busbars 43, 44A, 44B for connecting electric components are attached to a circuit board unit 41 disposed above a plurality of stacked battery cells 12. The busbar terminal is disposed on the lid 14.

(2) Electrical Configuration of Energy Storage Apparatus

Figure 10:
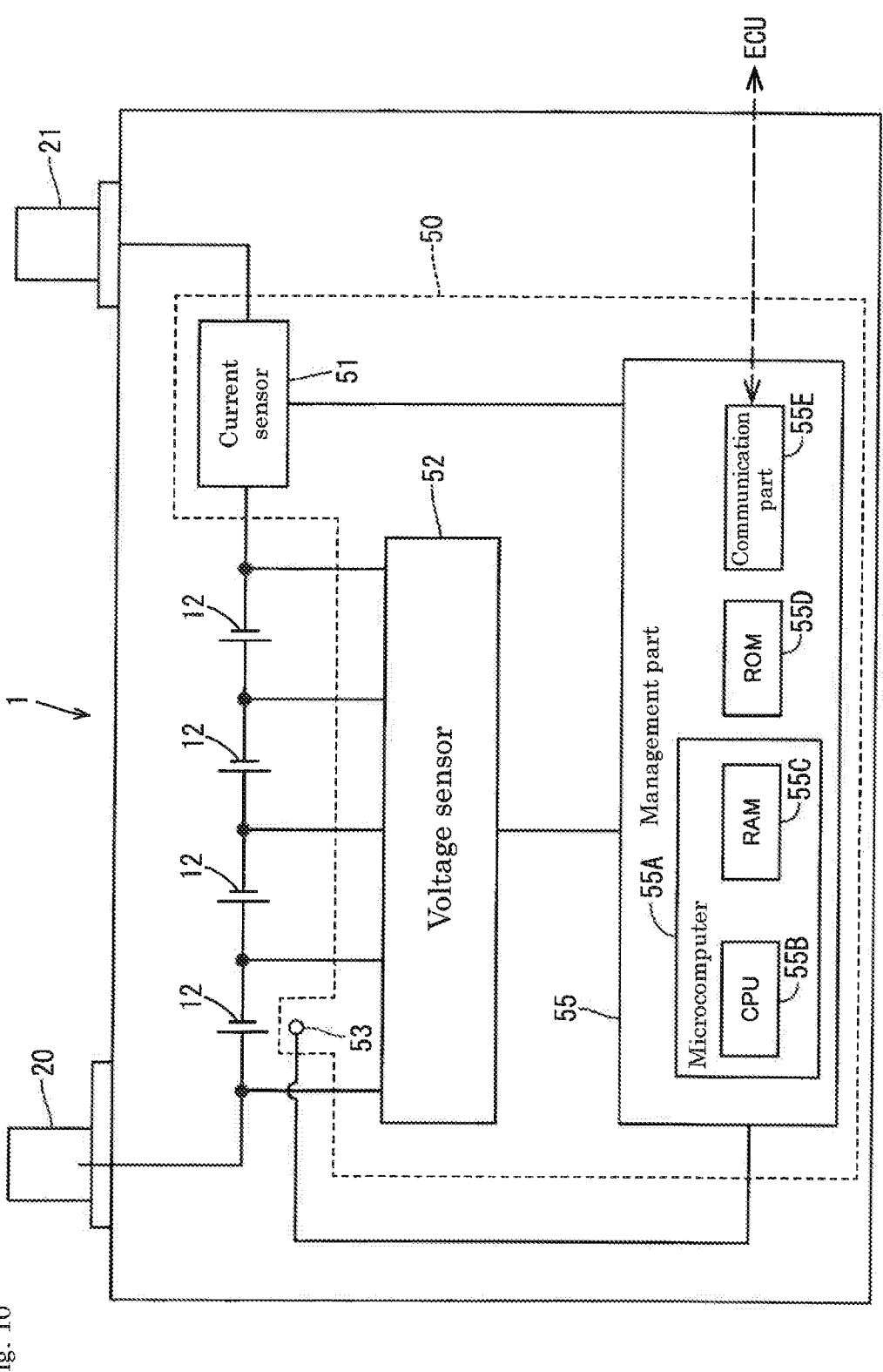
FIG. 10 is a schematic view illustrating an electrical configuration of the energy storage apparatus.

As illustrated in FIG. 10, the battery 1 includes twelve battery cells 12 (three battery cells 12 are indicated by one battery symbol in FIG. 10) and a battery management system (BMS) 50 that manages the battery cells 12. The BMS 50 is an example of a management apparatus.

The BMS 50 includes a current sensor 51, a voltage sensor 52, one or more temperature sensors 53, and a management part 55.

The current sensor 51 is connected in series with the battery cell 12. The current sensor 51 measures a charge-discharge current of the battery cell 12 and outputs the charge-discharge current to the management part 55. The voltage sensor 52 is connected in parallel to each battery cell 12. The voltage sensor 52 measures a terminal voltage of each battery cell 12 and outputs the terminal voltage to the management part 55. One or more temperature sensors 53 are provided in different battery cells 12, respectively, and measure the temperature of the battery cells 12 and output the measured temperature to the management part 55.

The management part 55 includes a microcomputer 55A (so-called microcomputer) in which a central processing unit (CPU) 55B, a random-access memory (RAM) 55C, and the like are integrated into one chip, a read-only memory (ROM) 55D, a communication part 55E, and the like. These are mounted on the circuit board unit 41 illustrated in FIG. 6. The ROM 55D stores a management program and various data. The management part 55 manages the battery cell 12 by performing a management program stored in the ROM 55D. The communication part 55E is for the microcomputer 55A to communicate with a system (e.g., engine control unit (ECU)) on the side of the automobile 2.

(3) Processing Performed by Management Part

SOC estimation processing (an example of estimation processing) and full-charge reset processing performed by the management part 55 will be described.

(3-1) SOC Estimation Processing

The SOC estimation processing is processing of estimating the state of charge (SOC) of the battery cell 12 by a current integration method. The current integration method is a method in which the amount of electric power flowing into and out of the battery cell 12 is measured by measuring the charge-discharge current of the battery cell 12 at predetermined time intervals with the current sensor 51, and the measured amount is then added to or subtracted from the initial capacity to estimate the SOC.

(3-2) Full-Charge Reset Processing

Figure 11:
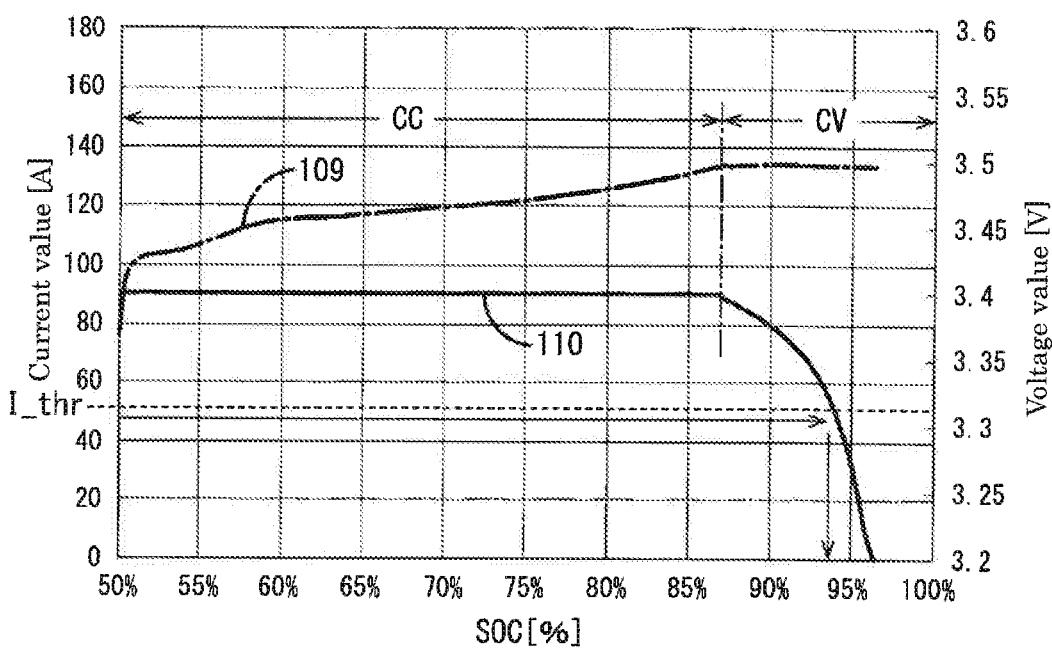
FIG. 11 is a graph of a current value and a voltage value when the charge is started in a state where the SOC is 50%.

The outline of the full-charge reset processing will be described with reference to FIG. 11. An example illustrated in FIG. 11 illustrates a case where the engine of the automobile 2 is started in a state where the SOC is 50%. When the engine is started, the charge of the battery cell 12 is started by the alternator of the automobile 2.

In FIG. 11, a dashed line 109 indicates a voltage value, and a solid line 110 indicates a change in current value. The battery cell 12 is subjected to the constant current charge (CC charge) until the voltage value of the battery cell 12 reaches a predetermined voltage value (3.50 V in the example illustrated in FIG. 11), and the battery cell 12 is subjected to the constant voltage charge (CV charge) when the voltage value reaches the predetermined voltage value (an example of a charge step). In the example illustrated in FIG. 11, the voltage value reaches 3.50 V at a time point when the SOC is approximately 87%, and the charge mode is switched to the constant voltage charge.

When the charge of the battery cell 12 is started, the management part 55 integrates current values measured at predetermined time intervals with the current sensor 51, and when the current value decreases to the threshold I_thr, the management part 55 determines the full charge of the battery cell 12 and terminates the integration. The integrated current value is an example of the amount of electricity charged during a period from the start of charge of the battery cell 12 to the full charge of the battery cell 12.

As described above, the current characteristic of the charge current varies depending on the temperature. The management part 55 measures the temperature of the battery cell 12 with the temperature sensor 53 during the charge of the battery cell 12 and updates the threshold I_thr in accordance with the changed temperature when the temperature of the battery cell 12 changes.

When the battery cell 12 is fully charged, the management part 55 determines the correction value of the estimated SOC value (an example of the estimated state-of-charge value) based on the temperature of the battery cell 12 at the time point of full charge and the amount of electricity described above and corrects the estimated SOC value with the determined correction value.

Figure 12:
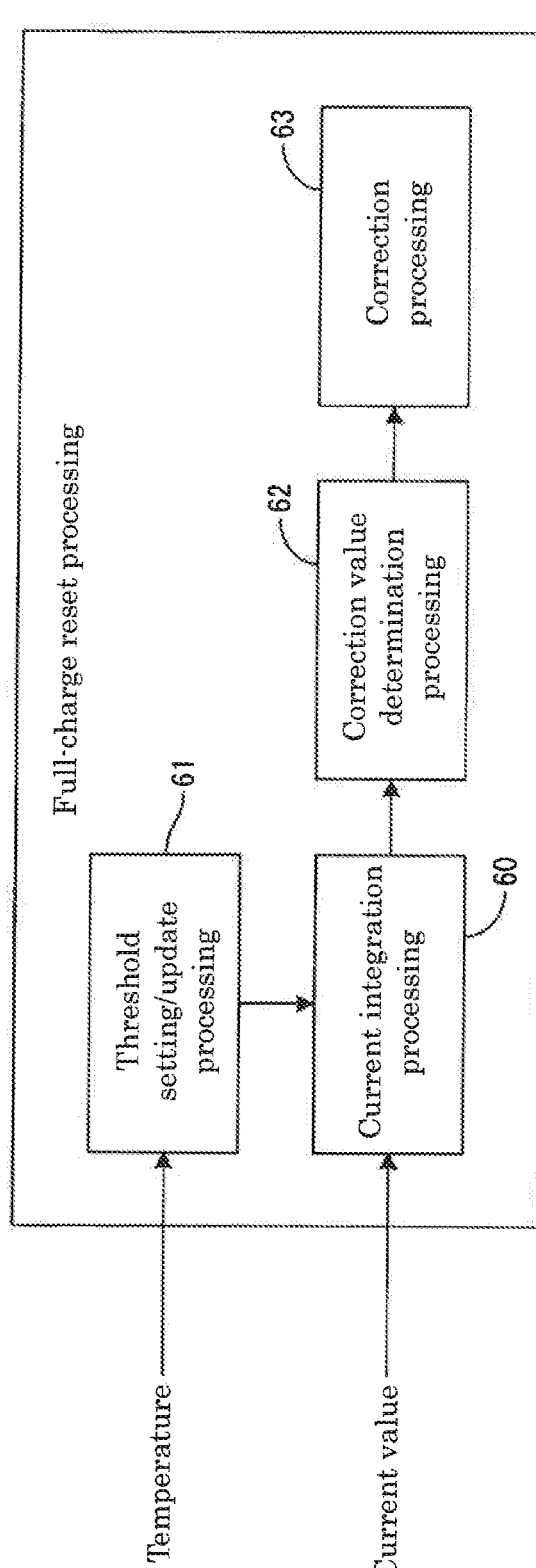
FIG. 12 is a block diagram of full-charge reset processing.

The full-charge reset processing will be described more specifically with reference to FIG. 12. The full-charge reset processing includes current integration processing 60, threshold setting/update processing 61 (an example of an update step), correction value determination processing 62 (an example of a determination step and determination processing), and correction processing 63 (an example of a correction step and correction processing).

A current integration processing 60 is processing of obtaining the amount of electricity charged by integrating current values. As described above, the management part 55 starts the integration of current values when the engine of the automobile 2 is started, and ends the integration when the current value decreases to the threshold I_thr. Whether or not the engine has been started can be determined by an appropriate method. For example, the start of the engine may be determined when an engine start signal (ignition-on signal, etc.) is received from an electronic control unit (ECU) of the automobile 2 via the communication part 55E.

The threshold setting/update processing 61 is processing of setting and updating the threshold I_thr in accordance with the temperature of the battery cell 12. Specifically, the management part 55 sets and updates the threshold I_thr with reference to a correction value table described below. The correction value table is a table created by the inventor of the present application through experiments.

TABLE 1

| | | Correction value | | | | |
|---|---|---|---|---|---|---|
| Temperature | Threshold [A] | . . . | n [Ah] | n + 1 [Ah] | n + 2 [Ah] | . . . |
| . . . | . . . | . . . | . . . | . . . | . . . | . . . |
| −25° C. | 2A | . . . | 98.0% | 95.0% | 91.0% | . . . |

TABLE 1-continued

| | | Correction value | | | |
|---|---|---|---|---|---|
| Temperature | Threshold [A] | . . . n [Ah] | n + 1 [Ah] | n + 2 [Ah] | . . . [Ah] |
| −24° C. | . . . | . . . . . . | . . . | . . . | . . . |
| . . . | . . . | . . . . . . | . . . | . . . | . . . |
| . . . | . . . | . . . . . . | . . . | . . . | . . . |
| 25° C. | 30A | . . . 99.7% | 99.6% | 99.0% | . . . |
| 26° C. | . . . | . . . . . . | . . . | . . . | . . . |
| . . . | . . . | . . . . . . | . . . | . . . | . . . |

A first column in the correction value table is the temperature of the battery cell 12. A second column is a threshold corresponding to the temperature. Since the current value for charging the battery cell 12 is smaller at low temperature (e.g., −25° C.) than at normal temperature (e.g., 250C), a smaller threshold is associated as the temperature of the battery cell 12 is lower. Third and subsequent columns will be described later. The correction value table described above is an example. Various numerical values in the correction value table are not limited to the values described above.

When the charge of the battery cell 12 is started, the management part 55 acquires a threshold corresponding to the temperature of the battery cell 12 at that time from the correction value table and sets the threshold as the threshold I_thr. When the temperature of the battery cell 12 changes during the charge of the battery cell 12, the management part 55 acquires a threshold corresponding to the changed temperature from the correction value table and updates the threshold I_thr with the acquired threshold.

The correction value determination processing 62 is processing of determining the correction value of the estimated SOC value based on the temperature of the battery cell 12 and the amount of electricity obtained by the current integration processing 60. The third and subsequent columns of the correction value table described above are the correction values of the estimated SOC values. The correction value here refers to an estimated value replaced with the present estimated SOC value, and the correction refers to overwriting the present estimated SOC value with the correction value. In the correction value table, n represents a specific amount of electricity [Ah]. The SOC at a time point when the battery cell 12 is fully charged (a time point when the current value decreases to the threshold I_thr) varies depending on the temperature of the battery cell 12 at that time point and the amount of charged electricity. Therefore, in the correction value table, a correction value is associated with each temperature and each amount of electricity.

When the battery cell 12 is fully charged, the management part 55 acquires a correction value corresponding to the amount of electricity obtained by the current integration processing 60 and the temperature of the battery cell 12 at the time point of full charge of the battery cell 12 from the correction value table, thereby determining the correction value. For example, when the temperature of the battery cell 12 at the time point of full charge of the battery cell 12 is 25° C. and the amount of charged electricity is n+1 [Ah], "99.6%" is determined as the correction value in the correction value table described above.

The correction processing 63 is processing of correcting the present estimated SOC value estimated by the SOC estimation processing with the correction value determined in the correction value determination processing 62. Specifically, the management part 55 overwrites the present estimated SOC value with the correction value determined in the correction value determination processing 62.

(4) Effects of Embodiment

According to the correction method of the first embodiment the correction value is determined based on the amount of electricity charged during the period from the start of charge of the battery cell 12 to the full charge of the energy storage device. Therefore, the estimated SOC value can be accurately corrected regardless of the SOC at the start of charge.

The correction method according to the first embodiment can accurately correct the estimated SOC value, and thus is particularly useful in the case of the battery cell 12 having the plateau region (the battery cell 12 in which accurate specification of the SOC from the OCV is difficult).

According to the correction method of the first embodiment, when the temperature of the battery cell 12 changes, the threshold I_thr is updated in accordance with the changed temperature. This makes it easier to determine whether or not the current value has decreased to the threshold as the temperature of the battery cell 12 increases. Hence the accuracy of correction at low temperature is improved as compared to a case where the threshold corresponding to the temperature at the start of charge is used as it is.

According to the correction method of the first embodiment, with the correction value being determined based on the temperature of the battery cell 12 and the amount of electricity charged, the estimated SOC value can be accurately corrected as compared to the case has been described as an example where the correction value is determined only from the amount of charged electricity.

The management apparatus according to the first embodiment can accurately correct the estimated SOC value regardless of the SOC at the start of charge.

The battery 1 according to the first embodiment can accurately correct the estimated SOC value.

Second Embodiment

A second embodiment is a modification example of the first embodiment. The battery cell 12 deteriorates with use. Deterioration means that an actual chargeable capacity decreases. Even when the amounts of charged electricity are the same, when the actual capacities are different, appropriate correction values are different. Therefore, in the second embodiment, the correction value is determined in consideration of the degradation of the battery cell 12 in addition to the temperature of the battery cell 12 and the amount of charged electricity. Specifically, the management part 55 according to the second embodiment determines the correction value by Equation 1 below:

$$\text{Correction value [\%]} = (\text{actual capacity [Ah] of battery cell 12} - \text{eigenvalue [Ah]})/\text{actual capacity [Ah] of battery cell 12} \times 100 \qquad \text{<Equation 1>.}$$

In Equation 1, the actual capacity of the battery cell 12 is the present actual capacity of the battery cell 12. The actual capacity of the battery cell 12 can be estimated by an appropriate method. For example, the temperature and the amount of charged and discharged electricity may be measured at predetermined time intervals (e.g., every several minutes), and the present actual capacity may be estimated using the measured values and the actual capacity held by the management part. Alternatively, the correlation between the internal resistance value of the battery cell 12 and the actual capacity of the battery cell 12 may be used to estimate the actual capacity from the internal resistance value. Alternatively, since the amount of electricity charged when the battery cell 12 is charged from a certain voltage V1 to a voltage V2 higher than the voltage V1 varies depending on the actual capacity of the battery cell 12, the battery cell 12 may be charged from the voltage V1 to the voltage V2, and the actual capacity may be obtained from the amount of electricity charged during that time.

The eigenvalue [Ah] is the difference between the present actual capacity of the battery cell 12 and the amount of electricity charged in the battery cell 12 at the time point when the battery cell 12 is fully charged (the time point when the current value decreases to the threshold I_thr). In other words, the eigenvalue is the remaining amount of electricity that can be charged until the SOC becomes 100% at the time point of full charge of the battery cell 12.

The eigenvalue (the remaining amount of electricity that can be charged) varies depending on the temperature of the battery cell 12 at the time point of full charge of the battery cell 12, and the amount of electricity charged during the period from the start of charge to the full charge of the battery cell 12. Thus, the management part 55 refers to an eigenvalue table (an example of eigenvalue information) shown below to acquire an eigenvalue. The eigenvalue table is a table in which an eigenvalue is associated with each temperature and each amount of electricity. The eigenvalue table is a table created by the inventor of the present application through experiments.

TABLE 2

| Temperature | ... [Ah] | n[Ah] | n + 1[Ah] | n + 2[Ah] | ... [Ah] |
|---|---|---|---|---|---|
| | | | Eigenvalue | | |
| ... | ... | ... | ... | ... | ... |
| −25° C. | ... | a [Ah] | b [Ah] | c [Ah] | ... |
| −24° C. | ... | ... | ... | ... | ... |
| ... | ... | ... | ... | ... | ... |
| ... | ... | ... | ... | ... | ... |
| 25° C. | ... | d [Ah] | e [Ah] | f [Ah] | ... |
| 26° C. | ... | ... | ... | ... | ... |
| ... | ... | ... | ... | ... | ... |

In the eigenvalue table, n and a to f each represent a specific amount of electricity [Ah]. A first column in the eigenvalue table is the temperature of the battery cell 12. Second and subsequent columns are eigenvalues. For example, when the temperature of the battery cell 12 at the time point of full charge of the battery cell 12 is 25° C., and the amount of electricity charged during the period from the start of charge to the full charge of the battery cell 12 is n+1 [Ah], e [Ah] is acquired as an eigenvalue in the eigenvalue table described above.

For example, it is assumed that the actual capacity of the battery cell 12 having not deteriorated is 1000 [Ah], the actual capacity of the battery cell 12 having deteriorated is 900 [Ah], and in both cases, 100 [Ah] is acquired as an eigenvalue. In this case, the correction value is 90% (=(1000−100)/1000) when the actual capacity is 1000 [Ah], and the correction value is 89% (=(900−100)/900) when the actual capacity is 900 [Ah]. Therefore, even when the eigenvalues are the same, the correction value decreases as the battery cell 12 deteriorates.

According to the correction method of the second embodiment, the eigenvalue table is created in advance by experiments, and the correction value is determined by Equation 1, whereby the correction value can be determined in accordance with the deterioration of the battery cell 12.

Therefore, even when the battery cell 12 deteriorates, the correction value can be determined appropriately.

Third Embodiment

Figure 13:
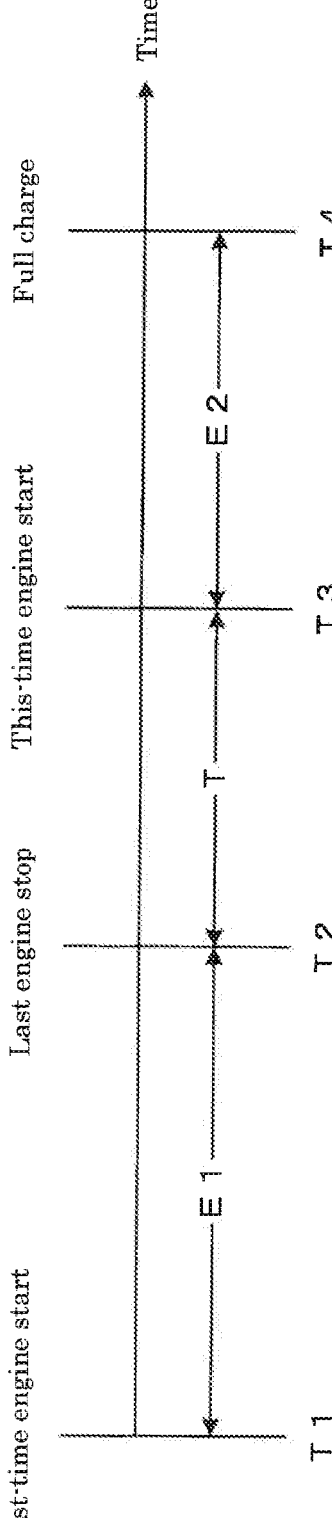
FIG. 13 is a schematic diagram explaining integration of a current value according to a third embodiment.

A third embodiment will be described with reference to FIG. 13. A third embodiment is a modification example of the first embodiment or the second embodiment. In FIG. 13, a time point T1 indicates a time point when the engine is started last time, a time point T2 indicates a time point when the engine is stopped last time, a time point T3 indicates a time point when the engine is started this time, and a time point T4 indicates a time point when the battery cell 12 is fully charged after the engine is started this time.

In the current integration processing 60 according to the third embodiment, the management part 55 further obtains the amount of electricity charged during a period from the start of the engine of the automobile 2 and the start of charge of the battery cell 12 to the stop of the engine in addition to the amount of electricity charged during the period from the start of the engine of the automobile 2 and the start of charge of the battery cell 12 to the full charge of the battery cell 12. Whether or not the engine has been stopped can be determined by an appropriate method. For example, when an engine stop signal (ignition off signal, etc.) is received from the ECU of the automobile 2, it may be determined that the engine is stopped.

In the correction value determination processing 62 according to the third embodiment, the management part 55 measures a time T from the last stop of the engine (time point T2) to the current start of the engine (time point T3) and determines whether or not the time T is equal to or shorter than a predetermined time. The predetermined time is a time required for eliminating polarization and can be determined appropriately by an experiment.

When the time T is longer than the predetermined time, the management part 55 determines the correction value of the estimated SOC value based on an amount E2 of electricity charged during a period from the start of the engine this time (time point T3) to the full charge of the battery cell 12 (time point T4) similarly to the first embodiment or the second embodiment.

On the other hand, when the time T is equal to or shorter than the predetermined time, the management part 55 adds an amount E1 of electricity charged from the start of the engine last time (time point T1) to the stop of the engine last time (time point T2) and the amount E2 of electricity charged during the period from the start of the engine this time (time point T3) to the full charge of the battery cell 12 (time point T4). The management part 55 determines the correction value by acquiring the correction value corresponding to a total value (=E1+E2) from the correction value table.

That is, in the third embodiment, when the time T is equal to or shorter than the predetermined time, the correction value is determined assuming that the engine was continuously operated from the start of the engine last time (time point T1) to the start of the engine this time and the full charge of the battery cell 12 (time point T4).

According to the correction method of the third embodiment, when the time T is equal to or shorter than the predetermined time, the correction value can be determined in consideration of the influence of polarization. It is thus possible to prevent a decrease in the accuracy of correction due to the influence of polarization.

Other Embodiments

The present invention is not limited to the above embodiments, and various modifications may be made without departing from the gist of the present invention. For example, to the configuration of one embodiment, a configuration of another embodiment can be added. A part of the configuration of one embodiment can be replaced with the configuration of another embodiment or a well-known technique. A part of the configuration of one embodiment can be eliminated. Further, a well-known technique can be added to the configuration of one embodiment.

(1) In the above embodiment, the case has been described as an example where the threshold I_thr is set and updated in accordance with the temperature of the battery cell 12. However, after the threshold I_thr is set in accordance with the temperature of the battery cell 12 when the charge of the battery cell 12 is started, the threshold I_thr may not be updated even when the temperature of the battery cell 12 changes during the charge.

(2) In the above embodiment, the case has been described as an example where the correction value is determined based on the temperature of the battery cell 12 and the amount of charged electricity, but the correction value may be determined based on the amount of electricity charged without considering the temperature.

(3) In the first embodiment, the case has been described as an example where the correction value is determined using the correction value table, but the correction value may be determined using a function for calculating the correction value from the temperature and the amount of charged electricity.

(4) In the first embodiment, the amount of electricity is set in the correction value table at an interval of 1 [Ah], but the interval can be selected appropriately. For example, the interval may be 5 [Ah] or may be 10 [Ah]. In this case, the correction value corresponding to the amount of electricity therebetween may be determined by linear interpolation, curve interpolation, or the like.

(5) In the second embodiment, the case has been described as an example where the eigenvalue is determined using the eigenvalue table, but the eigenvalue may be determined using a function for calculating the eigenvalue from the temperature and the amount of charged electricity.

(6) In the second embodiment, the amount of electricity is set in the eigenvalue table at intervals of 1 [Ah], but the intervals can be selected as appropriate. For example, the interval may be 5 [Ah] or may be 10 [Ah]. In this case, the eigenvalue corresponding to the amount of electricity therebetween may be determined by linear interpolation, curve interpolation, or the like.

(7) In the above embodiment, the battery cell 12 having the plateau region has been described as an example, but the battery cell 12 may not have the plateau region.

(8) In the above embodiment, the LFP-based or the Gr-based battery cell 12 has been described as an example of the battery cell 12 having the plateau region, but the battery cell 12 having the plateau region is not limited to the LFP-based or Gr-based battery cell.

(9) In the above embodiment, the battery cell 12 for starting the engine has been described as an example, but the application of the battery cell 12 is not limited thereto. For example, the battery cell 12 may be used for an auxiliary machine that is mounted on an electric vehicle or a hybrid vehicle and supplies electric power to the auxiliary machine, or may be used for a moving body that is mounted on a forklift or an automatic guided vehicle (AGV) traveling by an electric motor and supplies electric power to the electric motor. The battery cell 12 may be used for an uninterruptible power supply (UPS) or may be used for a mobile terminal or the like. The battery cell 12 may be used for peak shifting or may store renewable energy.

(10) In the above embodiment, the battery cell 12, which shifts to the constant voltage charge earlier as the SOC at the start of the charge is lower, has been described as an example. However, even a battery cell 12, which shifts to the constant voltage charge earlier as the SOC at the start of the charge is higher, can be made applicable by adjusting the correction value table and the eigenvalue table.

(11) In the first embodiment, as an example of "correcting the estimated state-of-charge value based on the correction value determined in the determination step", a case has been described where the estimated SOC value is corrected with the correction value immediately after the correction value is determined. In contrast, there may be a slight time lag between the determination of the correction value in the determination step and the correction of the estimated SOC value. In that case, there is a possibility that the battery cell 12 is charged and discharged and the SOC changes during the time lag. Therefore, in that case, the estimated SOC value may be corrected after the correction value is corrected based on the amount of electricity charged and discharged during the time lag. As described above, the timing for correcting the estimated SOC value is not limited to the timing immediately after the determination of the correction value in the determination step, and there may be a slight time lag.

(12) In the first embodiment, the lithium ion battery has been described as an example of the battery cell 12, but the battery cell 12 is not limited thereto. For example, the battery cell 12 may be a capacitor accompanied by an electrochemical reaction.

DESCRIPTION OF REFERENCE SIGNS

1: battery (example of energy storage apparatus)
2: automobile (example of vehicle)
12: battery cell (example of energy storage device)
50: BMS (example of management apparatus)
51: current sensor
53: temperature sensor
55: management part

The invention claimed is:

1. A correction method for an estimated state-of-charge value of an energy storage device estimated by a current integration method, the method comprising:

charging the energy storage device;

determining a correction value of the estimated state-of-charge value based on an amount of electricity charged during a period from a start of charge of the energy storage device to a decrease in a current value of a charge current to a predetermined threshold; and correcting the estimated state-of-charge value according directly to the correction value of the estimated state-of-charge value determined in the determining, wherein in the determining, the correction value is determined based on a temperature of the energy storage device and the amount of electricity, and wherein in the determining, an eigenvalue [Ah] corresponding to a combination of the temperature of the energy storage device and the amount of electricity is acquired from eigenvalue information in which the combination of the temperature of the energy storage device and the amount of electricity is associated with the eigenvalue, and the correction value is determined from Equation 1 below:

$$\text{Correction value [\%]=(actual capacity of energy}$$
$$\text{storage device [Ah]−eigenvalue [Ah])/actual}$$
$$\text{capacity of energy storage device [Ah]×100} \quad \text{<Equation 1>.}$$

2. The correction method according to claim 1, wherein the energy storage device has a plateau region in which an amount of change in open circuit voltage with respect to an amount of change in state of charge is small, and wherein the determining of the correction value of the estimated state-of-charge value is directly for the estimated state-of-charge value.

3. The correction method according to claim 1, further comprising measuring a temperature of the energy storage device at predetermined time intervals with a temperature sensor when charge of the energy storage device is started and updating the predetermined threshold in accordance with the measured temperature, wherein the correction value is of the estimated state-of-charge value itself.

4. The correction method according to claim 1, wherein the correcting of the estimated state-of-charge value comprises overwriting the estimated state-of-charge value with the correction value.

5. The correction method according to claim 1, wherein the correcting of the estimated state-of-charge value comprises changing the estimated state-of-charge value with the correction value, and wherein the estimated state-of-charge value is corrected immediately after the correction value is determined, or the estimated state-of-charge value is corrected after the correction value is corrected based on the amount of electricity charged and discharged during a time lag.

6. The correction method according to claim 1, wherein the correcting of the estimated state-of-charge value is at a time of full charge of the energy storage device.

7. A correction method for an estimated state-of-charge value of an energy storage device estimated by a current integration method, the method comprising:

charging the energy storage device;

determining a correction value of the estimated state-of-charge value based on an amount of electricity charged during a period from a start of charge of the energy storage device to a decrease in a current value of a charge current to a predetermined threshold; and correcting the estimated state-of-charge value according directly to the correction value of the estimated state-of-charge value determined in the determining, wherein the energy storage device comprises an engine starting energy storage device for starting an engine of a vehicle, and in the determining, when a time from a last stop of the engine to a start of the engine is equal to or shorter than a predetermined time, a correction value of the estimated state-of-charge value is determined based on a total value of an amount of electricity charged during a period from a start of the engine and a start of charge of the energy storage device last time to the last stop of the engine and an amount of electricity charged during a period from a start of the engine and a start of charge of the energy storage device this time to a decrease in the current value of the charge current to the predetermined threshold.

8. A management apparatus for an energy storage device, comprising:

a current sensor that measures a charge-discharge current of the energy storage device; and a management part;

wherein the management part comprising a processor that is configured to perform:

measuring a charge current of the energy storage device with the current sensor, estimating a state of charge of the energy storage device by a current integration method, determining a correction value of an estimated state-of-charge value based on an amount of electricity charged from a start of charge of the energy storage device; and correcting the estimated state-of-charge value according directly to the determined correction value of the estimated state-of-charge value, wherein in the determining, the correction value is determined based on a temperature of the energy storage device and the amount of electricity, and wherein in the determining, an eigenvalue [Ah] corresponding to a combination of the temperature of the energy storage device and the amount of electricity is acquired from eigenvalue information in which a combination of the temperature of the energy storage device and the amount of electricity is associated with the eigenvalue, and the correction value is determined from Equation 2 below:

$$\text{Correction value [\%]=(actual capacity of energy}$$
$$\text{storage device [Ah]−eigenvalue [Ah])/actual}$$
$$\text{capacity of energy storage device [Ah]×100} \quad \text{<Equation 22.}$$

9. The management apparatus according to claim 8, wherein in the determining, the correction value is determined based on an amount of electricity charged during a period from the start of charge of the energy storage device to a decrease in a current value of a charge current to a predetermined threshold.

10. The management apparatus according to claim 8, wherein in the determining, the correction value is determined based on the amount of electricity charged from the start of charge, at which the energy storage device is in a plateau region where an amount of change in open circuit voltage with respect to an amount of change in state of charge is small.

11. The management apparatus according to claim 9, wherein the management part is further configured to perform:

measuring a temperature of the energy storage device with a temperature sensor; and updating the predetermined threshold in accordance with the measured temperature.

12. The management apparatus according to claim 8, wherein the correcting further comprises overwriting the estimated state-of-charge value with the correction value.

13. The management apparatus according to claim 8, wherein the correcting of the estimated state-of-charge value comprises changing the estimated state-of-charge value with the correction value, and wherein the estimated state-of-charge value is corrected immediately after the correction value is determined, or the estimated state-of-charge value is corrected after the correction value is corrected based on the amount of electricity charged and discharged during a time lag, wherein the correcting of the estimated state-of-charge value is at a time of full charge of the energy storage device.

* * * * *